(12) United States Patent
Schwartz et al.

(10) Patent No.: US 9,378,192 B2
(45) Date of Patent: Jun. 28, 2016

(54) MEMORY CONTROLLER AND METHOD OF OPERATING THE SAME

(71) Applicant: SAMSUNG ELECTRONICS CO., LTD., Suwon-si, Gyeonggi-do (KR)

(72) Inventors: Moshe Schwartz, Rehovot (IL); Hong Rak Son, Anyang-si (KR); Jun Jin Kong, Yongin-si (KR); Jung Soo Chung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 101 days.

(21) Appl. No.: 14/205,478

(22) Filed: Mar. 12, 2014

(65) Prior Publication Data

US 2014/0281816 A1    Sep. 18, 2014

(30) Foreign Application Priority Data

Mar. 15, 2013 (KR) .................. 10-2013-0028056

(51) Int. Cl.
| | | |
|---|---|---|
| G06F 11/00 | (2006.01) | |
| G06F 17/22 | (2006.01) | |
| H03M 13/15 | (2006.01) | |
| H03M 13/29 | (2006.01) | |
| G06F 11/10 | (2006.01) | |

(52) U.S. Cl.
CPC .......... *G06F 17/2223* (2013.01); *G06F 11/004* (2013.01); *G06F 17/2217* (2013.01); *G06F 11/1072* (2013.01); *H03M 13/152* (2013.01); *H03M 13/2906* (2013.01)

(58) Field of Classification Search
CPC ............ G06F 11/1072; G06F 17/2223; G06F 17/2217; H03M 13/152; H03M 13/2906
USPC ......................................................... 714/768
See application file for complete search history.

(56) References Cited

U.S. PATENT DOCUMENTS

| | | | |
|---|---|---|---|
| 6,119,120 A * | 9/2000 | Miller | |
| 6,553,535 B1 * | 4/2003 | Asada et al. .................. | 714/777 |
| 6,661,839 B1 * | 12/2003 | Ishida .............. | G01R 31/31921 341/51 |
| 7,653,865 B2 * | 1/2010 | Demaj et al. .................. | 714/778 |
| 7,714,748 B1 * | 5/2010 | Chaichanavong .... | H03M 5/145 341/58 |
| 7,840,399 B2 * | 11/2010 | Suontausta et al. ............... | 704/8 |
| 8,788,848 B2 * | 7/2014 | Kirovski et al. .............. | 713/193 |
| 8,930,798 B2 * | 1/2015 | Cideciyan ........... | G06F 11/1072 341/94 |
| 2009/0259803 A1 | 10/2009 | Oh et al. | |
| 2009/0292973 A1 | 11/2009 | Seol et al. | |
| 2010/0195389 A1 | 8/2010 | Kim et al. | |
| 2011/0016263 A1 | 1/2011 | Lin et al. | |
| 2011/0032759 A1 | 2/2011 | Kim et al. | |
| 2011/0238891 A1 | 9/2011 | Chen et al. | |
| 2011/0276857 A1 | 11/2011 | Kim et al. | |
| 2013/0044876 A1 * | 2/2013 | Shaw et al. .................... | 380/255 |
| 2013/0187798 A1 * | 7/2013 | Marpe ................ | H03M 7/4081 341/67 |
| 2014/0289589 A1 * | 9/2014 | Jia et al. ........................ | 714/776 |
| 2014/0325310 A1 * | 10/2014 | Anholt et al. ................. | 714/764 |
| 2015/0149872 A1 * | 5/2015 | Mittelholzer et al. ........ | 714/773 |

* cited by examiner

*Primary Examiner* — James C Kerveros
(74) *Attorney, Agent, or Firm* — Volentine & Whitt, PLLC

(57) ABSTRACT

A method of operating a memory controller is provided. The method includes determining a data state based on an input stream including multiple alphabet letters, converting a part of the input stream, which corresponds to a conversion size, into alphabet letters in a lower numeral system when the data state is determined to be a first state among multiple predetermined data states, inserting one of the converted alphabet letters into the input stream, and outputting each of the alphabet letters in the input stream as is when the data state is determined to be a second state among the predetermined data states.

19 Claims, 20 Drawing Sheets

FIG. 7

| S3 | | |
|---|---|---|
| BASE-CONVERTED ALPHABET | | MAPPED ALPHABET |
| 0 | → | 0 |
| 1 | → | 1 |
| 2 | → | 2 |

FIG. 8

| S2 | | |
|---|---|---|
| BASE-CONVERTED ALPHABET | | MAPPED ALPHABET |
| 0 | → | 0 |
| 1 | → | 1 |
| 2 | → | 3 |

FIG. 9

| S3 | | |
|---|---|---|
| BASE-CONVERTED ALPHABET | | MAPPED ALPHABET |
| 0 | → | 0 |
| 1 | → | 1 |
| 2 | → | 2 |

| S4 | | |
|---|---|---|
| BASE-CONVERTED ALPHABET | | MAPPED ALPHABET |
| 0 | → | 0 |
| 1 | → | 1 |
| 2 | → | 3 |

FIG. 10A

| Input Time | Current State | Pattern Avoidance | Input | Pre-Output Buffer (First Sub-Buffer) | Output Time | Output | Change of State | Post-Output Buffer (First Sub-Buffer) |
|---|---|---|---|---|---|---|---|---|
| 1 | Initial | | 1 | | 1 | 1 | Initial →S1 | |
| 2 | S1 | Base-Converting | 2 | | 2 | 2 | S1→S4 | |
| 3 | S4 | | 3 | | | | | |
| 4 | | | 0 | | | | | |
| 5 | | | 3 | | | | | |
| 6 | | | 0 | | | | | |
| 7 | | | 0 | | | | | |
| 8 | | | 0 | | | | | |
| 9 | | | 0 | | | | | |
| 10 | | | 0 | | | | | |
| 11 | | | 0 | | | | | |
| 12 | | | 0 | | | | | |
| 13 | | | 0 | | | | | |
| 14 | | | 0 | | | | | |
| 15 | | | 0 | | | | | |
| 16 | | | 0 | | | | | |
| 17 | | | 0 | | | | | |
| 18 | | | 0 | | | | | |
| 19 | | | 0 | | | | | |
| 20 | | | 0 | | | | | |
| 21 | S2 | | 0 | 2,0,2,2,2,1,1,0,1,1,1,1,2,0,0,0,1,2,0,0,2,1,2,0 | 3 | 3 | S4→S2 | 0,2,2,2,1,1,0,1,1,1,1,2,0,0,0,1,2,0,0,2,1,2,0 |
| 22 | S3 | Pattern Avoidance | 0 | 0,2,2,2,1,1,0,1,1,1,1,2,0,0,0,1,2,0,0,2,1,2,0 | 4 | 0 | S2→S3 | 2,2,2,1,1,0,1,1,1,1,2,0,0,0,1,2,0,0,2,1,2,0 |
| | | | | | 5 | 0 | S3→S1 | 2,2,1,1,0,1,1,1,1,2,0,0,0,1,2,0,0,2,1,2,0 |

FIG. 10B

| Input Time | Current State | Pattern Avoidance | Input | Pre-Output Buffer (First Sub Buffer) | Output Time | Output | Change of State | Post-Output Buffer (First Sub Buffer) |
|---|---|---|---|---|---|---|---|---|
| 23 | S1 | | 0 | 2,2,2,1,1,0,1,1,1,2,0,0,0,1,2,0,0,2,1,2,0 | 6 | 0 | S1→S1 | 2,2,1,1,0,1,1,1,2,0,0,0,1,2,0,0,2,1,2,0 |
| 24 | S1 | | 3 | 2,2,2,1,1,0,1,1,1,2,0,0,0,1,2,0,0,2,1,2,0 | 7 | 3 | S1→S2 | 2,2,1,1,0,1,1,1,2,0,0,0,1,2,0,0,2,1,2,0 |
| 25 | S2 | | 1 | 2,2,2,1,1,0,1,1,1,2,0,0,0,1,2,0,0,2,1,2,0 | 8 | 1 | S2→S1 | 2,2,1,1,0,1,1,1,2,0,0,0,1,2,0,0,2,1,2,0 |
| 26 | S1 | | 2 | 2,2,2,1,1,0,1,1,1,2,0,0,0,1,2,0,0,2,1,2,0 | 9 | 2 | S1→S4 | 2,2,1,1,0,1,1,1,2,0,0,0,1,2,0,0,2,1,2,0 |
|  | S4 | Pattern Avoidance |  | 2,2,2,1,1,0,1,1,1,2,0,0,0,1,2,0,0,2,1,2,0 | 10 | 3 | S4→S2 | 2,2,1,1,0,1,1,1,2,0,0,0,1,2,0,0,2,1,2,0 |
| 27 | S2 | | 3 | 2,2,1,1,0,1,1,1,2,0,0,0,1,2,0,0,2,1,2,0 | 11 | 3 | S2→S2 | 2,2,1,1,0,1,1,1,2,0,0,0,1,2,0,0,2,1,2,0 |
| 28 | S2 | | 0 | 2,2,1,1,0,1,1,1,2,0,0,0,1,2,0,0,2,1,2,0 | 12 | 0 | S2→S3 | 2,2,1,1,0,1,1,1,2,0,0,0,1,2,0,0,2,1,2,0 |
|  | S3 | Pattern Avoidance |  | 2,2,1,1,0,1,1,1,2,0,0,0,1,2,0,0,2,1,2,0 | 13 | 2 | S3→S4 | 2,1,1,0,1,1,1,1,2,0,0,0,1,2,0,0,2,1,2,0 |
|  | S4 | Pattern Avoidance |  | 2,1,1,0,1,1,1,1,2,0,0,1,2,0,0,2,1,2,0 | 14 | 3 | S4→S2 | 1,1,0,1,1,1,1,2,0,0,0,1,2,0,0,2,1,2,0 |
| 29 | S2 | | 3 | 1,1,0,1,1,1,1,2,0,0,0,1,2,0,0,2,1,2,0 | 15 | 3 | S2→S2 | 1,1,0,1,1,1,1,2,0,0,0,1,2,0,0,2,1,2,0 |
| 30 | S2 | | 3 | 1,1,0,1,1,1,1,2,0,0,0,1,2,0,0,2,1,2,0 | 16 | 3 | S2→S2 | 1,1,0,1,1,1,1,2,0,0,0,1,2,0,0,2,1,2,0 |
| 31 | S2 | | 0 | 1,1,0,1,1,1,1,2,0,0,0,1,2,0,0,2,1,2,0 | 17 | 0 | S2→S3 | 1,1,0,1,1,1,1,2,0,0,0,1,2,0,0,2,1,2,0 |
|  | S3 | Pattern Avoidance |  | 1,1,0,1,1,1,1,2,0,0,0,1,2,0,0,2,1,2,0 | 18 | 1 | S3→S1 | 1,0,1,1,1,1,1,2,0,0,0,1,2,0,0,2,1,2,0 |
| 32 | S1 | | 0 | 1,0,1,1,1,1,1,2,0,0,0,1,2,0,0,2,1,2,0 | 19 | 0 | S1→S1 | 1,0,1,1,1,1,1,2,0,0,0,1,2,0,0,2,1,2,0 |
| 33 | S1 | | 3 | 1,0,1,1,1,1,1,2,0,0,0,1,2,0,0,2,1,2,0 | 20 | 3 | S1→S2 | 1,0,1,1,1,1,1,2,0,0,0,1,2,0,0,2,1,2,0 |
| 34 | S2 | | 0 | 1,0,1,1,1,1,1,2,0,0,0,1,2,0,0,2,1,2,0 | 21 | 0 | S2→S3 | 1,0,1,1,1,1,1,2,0,0,0,1,2,0,0,2,1,2,0 |
|  | S3 | Pattern Avoidance |  | 1,0,1,1,1,1,1,2,0,0,0,1,2,0,0,2,1,2,0 | 22 | 1 | S3→S1 | 0,1,1,1,1,1,1,2,0,0,0,1,2,0,0,2,1,2,0 |
| 35 | S1 | | 1 | 0,1,1,1,1,1,1,2,0,0,0,1,2,0,0,2,1,2,0 | 23 | 1 | S1→S1 | 0,1,1,1,1,1,2,0,0,0,1,2,0,0,2,1,2,0 |

FIG. 10C

| Input Time | Current State | Pattern Avoidance | Input | Pre-Output Buffer (First Sub Buffer) | Output Time | Output | Change of State | Post-Output Buffer (First Sub Buffer) |
|---|---|---|---|---|---|---|---|---|
| 36 | S1 |  | 3 | 0,1,1,1,1,2,0,0,0,1,2,0,0,2,1,2,0 | 24 | 3 | S1→S2 | 0,1,1,1,1,2,0,0,0,1,2,0,0,2,1,2,0 |
| 37 | S2 |  | 0 | 0,1,1,1,2,0,0,0,1,2,0,0,2,1,2,0 | 25 | 0 | S2→S3 | 0,1,1,1,2,0,0,0,1,2,0,0,2,1,2,0 |
|  | S3 | Pattern Avoidance |  | 0,1,1,1,2,0,0,0,1,2,0,0,2,1,2,0 | 26 | 0 | S3→S1 | 1,1,1,2,0,0,0,1,2,0,0,2,1,2,0 |
| 38 | S1 |  | 2 | 1,1,1,2,0,0,0,1,2,0,0,2,1,2,0 | 27 | 2 | S1→S4 | 1,1,1,2,0,0,0,1,2,0,0,2,1,2,0 |
|  | S4 | Pattern Avoidance |  | 1,1,1,2,0,0,0,1,2,0,0,2,1,2,0 | 28 | 1 | S4→S1 | 1,1,1,2,0,0,1,2,0,0,2,1,2,0 |
| 39 | S1 |  | 2 | 1,1,2,0,0,1,2,0,0,2,1,2,0 | 29 | 2 | S1→S4 | 1,1,2,0,0,1,2,0,0,2,1,2,0 |
|  | S4 | Pattern Avoidance |  | 1,1,2,0,0,1,2,0,0,2,1,2,0 | 30 | 1 | S4→S1 | 1,1,2,0,0,1,2,0,0,2,1,2,0 |
| 40 | S1 |  | 2 | 1,1,2,0,0,0,1,2,0,0,2,1,2,0 | 31 | 2 | S1→S4 | 1,1,2,0,0,1,2,0,0,2,1,2,0 |
|  | S4 | Last Padding |  | 1,1,2,0,0,0,1,2,0,0,2,1,2,0 | 32 | 1 |  | 1,2,0,0,1,2,0,0,2,1,2,0 |
|  | S4 |  |  | 1,2,0,0,0,1,2,0,0,2,1,2,0 | 33 | 1 |  | 2,0,0,1,2,0,0,2,1,2,0 |
|  | S4 |  |  | 2,0,0,0,1,2,0,0,2,1,2,0 | 34 | 2 |  | 0,0,1,2,0,0,2,1,2,0 |
|  | S4 |  |  | 0,0,0,1,2,0,0,2,1,2,0 | 35 | 0 |  | 0,0,1,2,0,0,2,1,2,0 |
|  | S4 |  |  | 0,0,1,2,0,0,2,1,2,0 | 36 | 0 |  | 0,1,2,0,0,2,1,2,0 |
|  | S4 |  |  | 0,1,2,0,0,2,1,2,0 | 37 | 0 |  | 1,2,0,0,2,1,2,0 |
|  | S4 |  |  | 1,2,0,0,2,1,2,0 | 38 | 1 |  | 2,0,0,2,1,2,0 |
|  | S4 |  |  | 2,0,0,2,1,2,0 | 39 | 2 |  | 0,0,2,1,2,0 |
|  | S4 |  |  | 0,0,2,1,2,0 | 40 | 0 |  | 0,2,1,2,0 |
|  | S4 |  |  | 0,2,1,2,0 | 41 | 0 |  | 2,1,2,0 |
|  | S4 |  |  | 2,1,2,0 | 42 | 2 |  | 1,2,0 |
|  | S4 |  |  | 1,2,0 | 43 | 1 |  | 2,0 |
|  | S4 |  |  | 2,0 | 44 | 2 |  | 0 |
|  | S4 |  |  | 0 | 45 | 0 |  |  |

MEMORY CONTROLLER AND METHOD OF OPERATING THE SAME

CROSS-REFERENCE TO RELATED APPLICATIONS

A claim for priority under 35 U.S.C. §119 is made to Korean Patent Application No. 10-2013-0028056, filed on Mar. 15, 2013, in the Korean Intellectual Property Office, the entire contents of which are hereby incorporated by reference

BACKGROUND

Embodiments of the inventive concept relate to a memory controller and a method of operating the same, and more particularly, to a memory controller that reduces data loss and a method of operating the same.

A memory device includes memory cells that store data. To enable a system including the memory device to operate normally, errors in the data need to be minimized. The memory device may include component(s) for correcting errors in data. When the memory cells are densely formed in a small area, data loss may occur due to interference between memory cells in which data are stored.

SUMMARY

According to embodiments of the inventive concept, there is provided a method of operating a memory controller. The method includes determining a data state based on an input stream including multiple alphabet letters; converting a part of the input stream, which corresponds to a conversion size, into alphabet letters in a lower numeral system when the data state is determined to be a first state among multiple predetermined data states; inserting one of the converted alphabet letters into the input stream; and outputting each of the alphabet letters in the input stream as it is when the data state is determined to be a second state among the predetermined data states.

The method may further include determining whether the one converted alphabet letter can be output in the data state determined based on the input stream; and mapping the one converted alphabet letter to a different alphabet letter according to a determination result.

The method may further include storing the converted alphabet letters in a first sub buffer. The part of the input stream is converted into the alphabet letters in the lower numeral system when the first sub buffer is empty. The method may further include sequentially inserting converted alphabet letters remaining in the first sub buffer into the input stream when reception of the input stream is completed.

The method may further include determining a data state based on read data including alphabet letters, restoring a part of the read data to a higher numeral system, and inserting the restored part into the read data. The method may also include mapping each of the alphabet letters in the read data to a different alphabet letter according to the data state determined based on the read data. A size of the restored part of the read data may be the conversion size.

The first state may be a data state in which at least one of the alphabet letters cannot be output. The second state may be a data state in which all of the alphabet letters can be output. The conversion size may be determined depending on a size of the input stream.

According to other embodiments of the inventive concept, there is provided a memory controller including a pattern transformer and a pattern de-transformer. The pattern transformer is configured to convert a part of an input stream including multiple alphabet letters from a higher numeral system to a lower numeral system when a data state is determined to be a first state among multiple predetermined data states based on the input stream, and to insert the converted part into the input stream. The pattern de-transformer is configured to convert a part of read data including multiple alphabet letters to the higher numeral system when a data state is determined to be the first state based on the read data, and to insert the converted part into the read data, the read data being obtained by reading the input stream that has been written to a memory device. The first state is a data state in which at least one of the alphabet letters cannot be output.

The pattern transformer may include a first base converter configured to convert the part of the input stream into the lower numeral system; a first sub buffer configured to store the converted part; a first mapper configured to map an alphabet letter in the converted part to a different alphabet letter when the alphabet letter in the converted part cannot be output in the first state; a first main buffer configured to store the input stream and a mapped alphabet letter; and a first finite state machine configured to determine the data state based on the input stream and the mapped alphabet letter, and to control the first main buffer and the first mapper. The part of the input stream may have a conversion size.

The pattern de-transformer may include a second mapper configured to map each of the alphabet letters in the read data to a different alphabet letter according to the data state determined based on the read data; a second sub buffer configured to store the mapped alphabet letters; a second base converter configured to restore alphabet letters to the higher numeral system from the mapped alphabet letters; a second main buffer configured to store the read data and the restored alphabet letters; and a second finite state machine configured to determine the data state based on the read data, and to control the second main buffer and the second mapper. The number of restored alphabet letters may be the same as the conversion size.

The conversion size may be determined depending on a size of the input stream.

According to further embodiments of the inventive concept, there is provided a memory system including the above-described memory controller, and a memory device configured to write the input stream from the memory controller and to read the input stream under control of the memory controller, and to output a read input stream as the read data.

According to other embodiments of the inventive concept, there is provided a memory device including a memory cell array and a memory controller. The memory cell array includes multiple multi-level memory cells for storing at least one of binary, ternary or quaternary data, and a memory controller for converting an input stream received from a host to provide write data that is stored in the memory device, and for converting read data received from the memory device to provide an output stream to the host, the read data corresponding to the stored write data. The memory controller is configured to convert a part of the input stream comprising multiple alphabet letters from a higher numeral system to a lower numeral system when a data state is determined to be a first state among multiple predetermined data states, and to insert the converted part into the input stream to provide the write data. The memory controller is further configured to convert a part of the read data including alphabet letters from the lower numeral system to the higher numeral system when a data state is determined to be the first state based on the read data, and to insert the converted part into the read data to provide the output stream.

BRIEF DESCRIPTION OF THE DRAWINGS

The above and other features and advantages will become apparent from the following description of various embodiments with reference to the attached drawings, in which:

FIG. 7 is a diagram for explaining operations of a first mapper and a second mapper when the data state is determined based on the data state graph illustrated in FIG. 4, according to an embodiment of the inventive concept;

FIG. 8 is a diagram for explaining operations of a first mapper and a second mapper when the data state is determined based on the data state graph illustrated in FIG. 5, according to an embodiment of the inventive concept;

FIG. 9 is a diagram for explaining operations of a first mapper and a second mapper when the data state is determined based on the data state graph illustrated in FIG. 6, according to an embodiment of the inventive concept;

FIGS. 10A through 10C are diagrams for explaining operation of the pattern transformer when the data state is determined based on the data state graph illustrated in FIG. 6, according to an embodiment of the inventive concept;

DETAILED DESCRIPTION OF THE EMBODIMENTS

Figure 1:
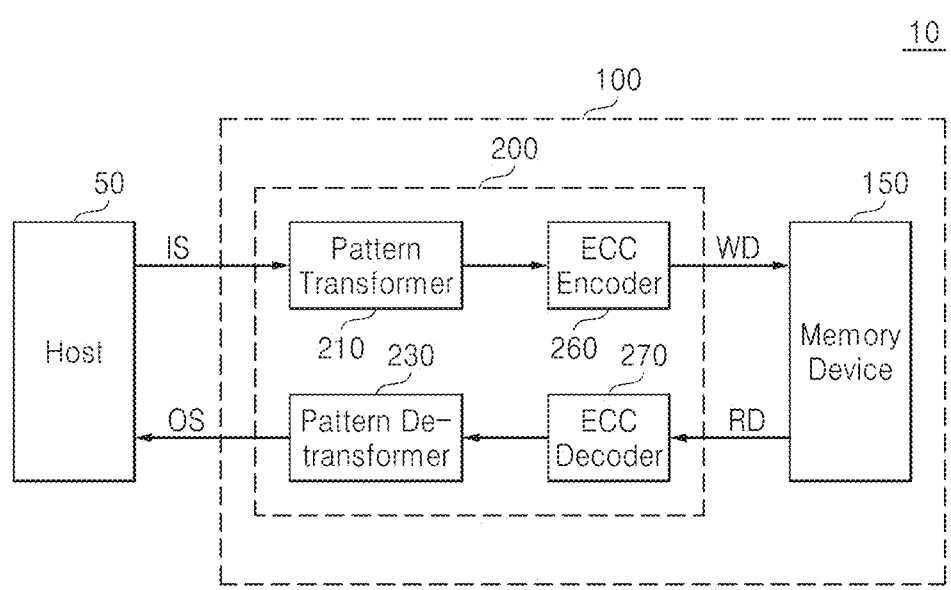
FIG. 1 is a block diagram of an electronic system, according to embodiments of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc., may be used herein to describe various elements, these elements should not be limited by these terms. These terms are only used to distinguish one element from another. For example, a first signal could be termed a second signal, and similarly, a second signal could be termed a first signal without departing from the scope of the present teachings.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "exemplary" refers to an illustration or example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an electronic system 10, according to an embodiment of the inventive concept. The electronic system 10 may be implemented as an electronic device or a portable device, such as a mobile telephone, a smart phone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, or an e-book, for example. The electronic system 10 includes a host 50 and a memory system 100.

The host 50 may include a processor, a display, and an input device for the operation of the electronic system 10. The host 50 may transmit data to and receive data from the memory system 100. When necessary, the host 50 may store data in the memory system 100 or fetch data from the memory system 100.

The memory system 100 is configured to exchange data in stream format with the host 50. In other words, the memory system 100 may receive an input stream IS from the host 50 and transmit an output stream OS to the host 50. The memory system 100 includes a memory device 150 and a memory controller 200.

The memory device 150 may include a memory cell array (not shown), a read/write circuit (not shown), and control logic (not shown). The memory cell array may include a plurality of memory cells that store data. The memory cells may store data using voltage level differences for binary, ternary or quaternary data, for example. In other words, the memory cells may be multi-level cells (MLCs).

The memory cells may be implemented as non-volatile memory cells that retain stored data even when not powered, or volatile memory cells that retain data only when powered. Data may be stored in the memory cells by physically cutting a fuse using a laser or by electrically programming, for example. The memory cells may be dynamic random access memory (DRAM) cells, static RAM (SRAM) cells, electrically erasable programmable read-only memory (EEPROM) cells, flash memory cells, magnetic RAM (MRAM) cells, conductive bridging RAM (CBRAM) cells, ferroelectric RAM (FeRAM) cells, phase-change RAM (PRAM) cells, or resistive RAM (RRAM or ReRAM) cells, for example, although other types of memory cells may be incorporated without departing from the scope of the present teachings. The, the memory cell array may be implemented in two or three dimensions.

The read/write circuit may read data from or write data to an address in the memory cell array according to an address signal and a command, which are received from the memory controller 200. The control logic controls the overall operation of the memory device 150.

The memory controller 200 generates address signals and commands for controlling operation of the memory device 150. The memory controller 200 is configured to convert the input stream IS into write data WD and to convert read data RD into the output stream OS. For purposes of illustration, the read data RD corresponds to the write data WD written in the memory device 150. In the depicted embodiment, the memory controller 200 includes a pattern transformer 210, a pattern de-transformer 230, an error correction code (ECC) encoder 260, and an ECC decoder 270.

The pattern transformer 210 receives the input stream IS from the host 50 and transforms the input stream IS to avoid forbidden pattern(s) in the input stream IS, as needed. When the memory cells included in the memory cell array are MLCs, each of the memory cells has multiple threshold voltage distribution states respectively corresponding to multiple levels. The threshold voltage distribution of each of the states may be wider than a desired window due to various factors. For instance, the threshold voltage distribution may be wider due to coupling (e.g., F-poly coupling) between adjacent memory cells during a program operation. Due to such coupling, it may fail to read data from a memory cell. In particular, coupling may be worse when a particular data pattern, i.e., a forbidden pattern (e.g., P3-E-P3) included in the read data RD is stored across adjacent memory cells.

The pattern de-transformer 230 restores the forbidden pattern(s) in the decoded read data RD received from the ECC decoder 270, and outputs the output stream OS. The ECC encoder 260 encodes the transformed input stream IS received from the pattern transformer 210 and outputs the write data WD. The ECC decoder 270 decodes the read data RD received from the memory device 150 and outputs the decoded read data RD, for detecting and correcting errors.

Figure 2:
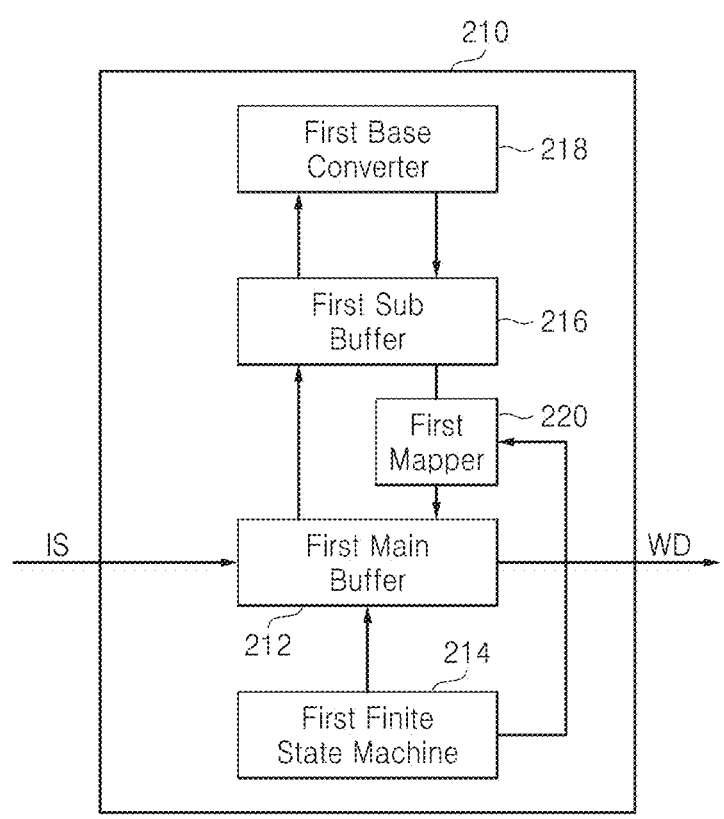
FIG. 2 is a block diagram of a pattern transformer illustrated in FIG. 1, according to an embodiment of the inventive concept.

FIG. 2 is a block diagram of the pattern transformer 210 illustrated in FIG. 1, according to an embodiment of the inventive concept. Referring to FIGS. 1 and 2, the pattern transformer 210 includes a first main buffer 212, a first finite state machine (FSM) 214, a first sub buffer 216, a first base converter 218, and a first mapper 220.

The first main buffer 212 temporarily stores the input stream IS received from the host 50. When the first sub buffer 216 is empty, the first main buffer 212 transmits a part of an "alphabet" (e.g., a set or string of "letters," which may be alphanumeric symbols or digits, for example) included in the input stream IS to the first sub buffer 216 under control of the first FSM 214. Here, the part of the alphabet transmitted to the first sub buffer 214 may have a size corresponding to a conversion size (e.g., number of letters converted to another numeral system). For instance, when the conversion size is ten, the part of the alphabet transmitted to the first sub buffer 214 may be made up of ten letters. An illustrative method of determining the conversion size will be described below with reference to FIG. 6.

The first main buffer 212 receives at least one alphabet letter mapped (referred to as "at least one mapped alphabet letter") from the first mapper 220, and inserts the at least one alphabet letter into the input stream IS under control of the first FSM 214. After receiving all of the input stream IS from the host 50, the first main buffer 212 receives at least one base-converted alphabet letter remaining in the first sub buffer 216 through the first mapper 220, and inserts the at least one base-converted alphabet letter into the input stream IS at the end of the input stream IS under control of the first FSM 214. The first main buffer 212 transmits the input stream IS to the ECC encoder 260 under control of the first FSM 214.

The first FSM 214 determines a data state (e.g., S1, S2, S3, or S4) based on the input stream IS temporarily stored in the first main buffer 212 or the at least one mapped alphabet letter. The first FSM 214 controls the first main buffer 212 and/or the first mapper 220 according to the data state that has been determined. The determination of the data state and the control operation of the first FSM 214 will be described below with reference to FIGS. 4 through 10C.

The first sub buffer 216 temporarily stores the part of the alphabet included in the input stream IS, which is received from the first main buffer 212, and then transmits it to the first base converter 218. In addition, the first sub buffer 216 temporarily stores base-converted alphabet letters received from the first base converter 218 and then transmits them to the first mapper 220.

The first base converter 218 receives the part of the alphabet included in the input stream IS, and converts it into letters of an alphabet in a lower numeral system. For instance, the first base converter 218 may receive a string of "3000" in a quaternary numeral system (base-4) and convert it into a string of "21010" in a ternary numeral system (base-3). The first base converter 218 transmits the base-converted alphabet letters to the first sub buffer 216.

When the base-converted alphabet letters received from the first sub buffer 216 cannot be output in a current data state, the first mapper 220 maps the base-converted alphabet letters to different alphabet letters under control of the first FSM 214.

When the base-converted alphabet letters received from the first sub buffer 216 can be output in the current data state, the first mapper 220 maps the base-converted alphabet letters to the same alphabet letters under control of the first FSM 214. For instance, the first mapper 220 may map a base-converted alphabet letter "2" to the same alphabet letter "2" and map a base-converted alphabet letter "1" to a different alphabet letter, such as "0." The first mapper 220 transmits the mapped alphabet letter to the first main buffer 212.

Figure 3:
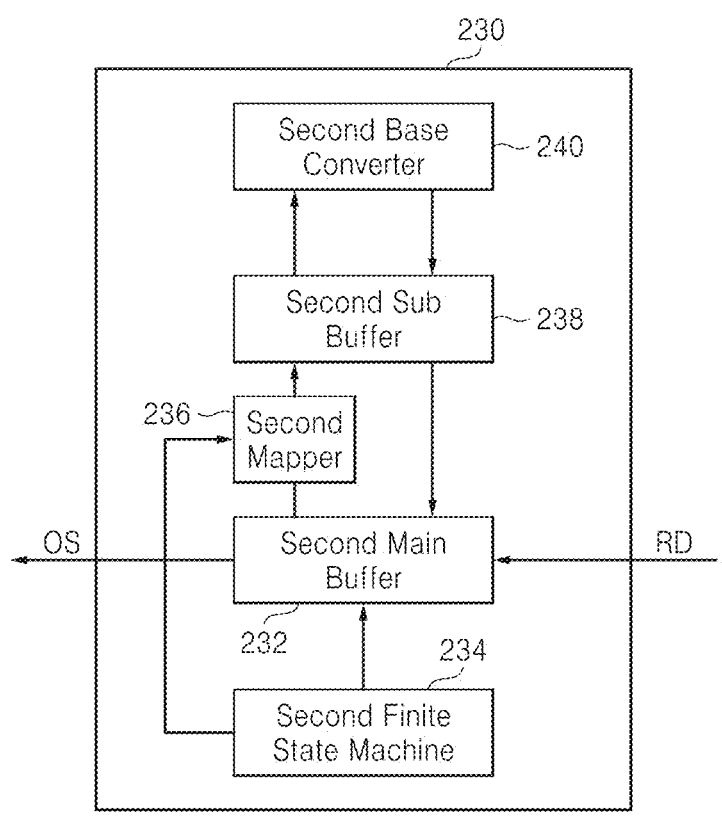
FIG. 3 is a block diagram of a pattern de-transformer illustrated in FIG. 1, according to an embodiment of the inventive concept.

FIG. 3 is a block diagram of the pattern de-transformer 230 illustrated in FIG. 1, according to an embodiment of the inventive concept. Referring to FIGS. 1 through 3, the pattern de-transformer 230 includes a second main buffer 232, a second FSM 234, a second mapper 236, a second sub buffer 238, and a second base converter 240.

The second main buffer 232 temporarily stores the decoded read data RD received from the ECC decoder 270. The second main buffer 232 transmits at least one alphabet letter of an alphabet included in the decoded read data RD to the second mapper 236 under control of the second FSM 234.

When the second sub buffer 238 is empty, the second main buffer 232 sequentially receives and temporarily stores the decoded read data RD with a space corresponding to the conversion size being empty under control of the second FSM 234, while transmitting the at least one alphabet letter to the second mapper 236. The second main buffer 232 receives base-restored alphabet letters from the second sub buffer 238 and inserts them into the empty space. The second main buffer 232 transmits the restored read data RD to the host 50 as the output stream OS.

The second FSM 234 determines a data state (e.g., S1, S2, S3, or S4) according to the decoded read data RD temporarily stored in the second main buffer 232. The second FSM 234 controls the second main buffer 232 and/or the second mapper 236 according to the determined data state. The determination of the data state and the control operation of the second FSM 234 will be described in detail below with reference to FIGS. 4 through 10C.

The second mapper 236 may map the at least one alphabet letter received from the second main buffer 232 to a different alphabet letter under control of the second FSM 234. For instance, the second mapper 236 may map the at least one alphabet letter "1" to a different alphabet letter "2" and map "0" to "1."

Figure 6:
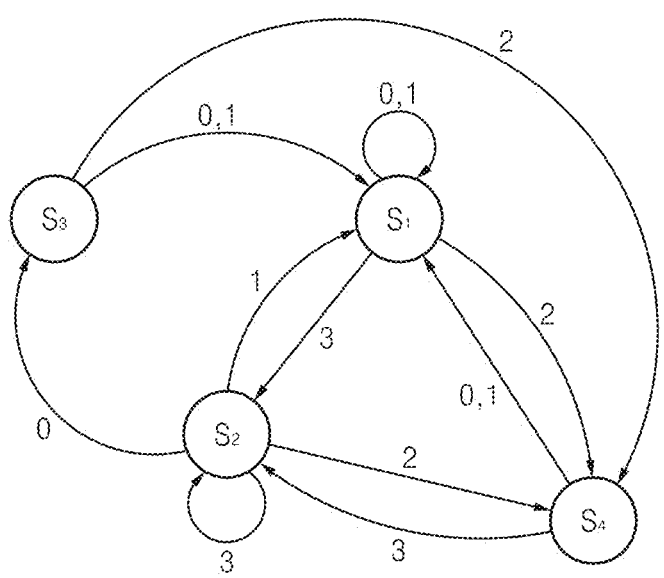
FIG. 6 is a diagram of a data state graph on which the first FSM illustrated in FIG. 2 and the second FSM illustrated in FIG. 3 base determination of a data state, according to an embodiment of the inventive concept.

The second mapper 236 performs reverse mapping to the mapping performed by the first mapper 240 illustrated in FIG. 2 in the same data state. For instance, when the first mapper 220 maps "2" to "3" in the data state S4 as shown in FIG. 6, the second mapper 236 maps "3" to "2." For this operation, the first and second FSMs 214 and 234 may share mapping information with respect to the data states. The second mapper 236 transmits the at least one mapped alphabet letter to the second sub buffer 238.

The second sub buffer 238 temporarily stores the at least one mapped alphabet letter received from the second mapper 236, and then transmits the at least one mapped alphabet letter to the second base converter 240. In addition, the second sub buffer 238 also temporarily stores base-restored alphabet letters received from the second base converter 240 and then transmits them to the second main buffer 232.

The second base converter 240 receives the at least one mapped alphabet letter. When the second base converter 240 receives as many alphabet letters as a size of a string into which a string of alphabet letters corresponding to the conversion size is converted (for example, 24 letters of the ternary numeral system into which 19 letters corresponding to a conversion size of 19 in the quaternary numeral system are converted), the second base converter 240 may restore alphabet letters in a higher numeral system from the letters of a current numeral system. For instance, the second base converter 240 may receive "21010" in the ternary number system and restore "3000" over the quaternary numeral system. The second base converter 240 transmits the base-restored alphabet letters to the second sub buffer 238.

Figure 4:
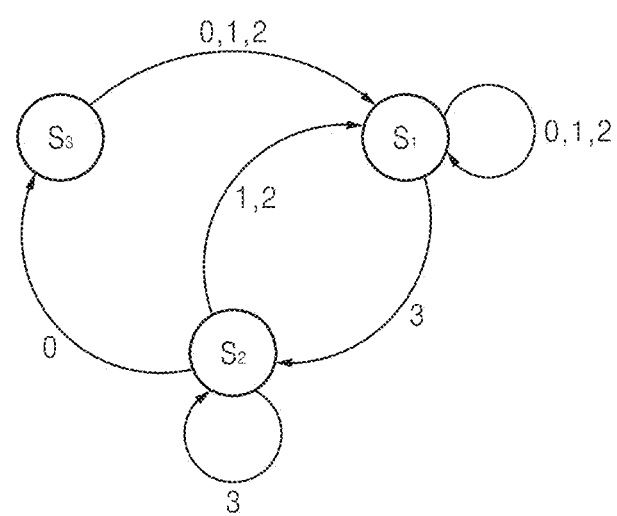
FIG. 4 is a diagram of a data state graph on which a first finite state machine (FSM) illustrated in FIG. 2 and a second FSM illustrated in FIG. 3 base determination of a data state, according to an embodiment of the inventive concept.
Figure 5:
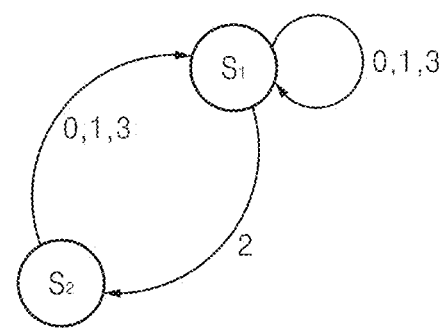
FIG. 5 is a diagram of a data state graph on which the first FSM illustrated in FIG. 2 and the second FSM illustrated in FIG. 3 base determination of a data state, according to an embodiment of the inventive concept.

FIG. 4 is a diagram of a data state graph based on which the first FSM 214 illustrated in FIG. 2 and the second FSM 234 illustrated in FIG. 3 determine a data state, according to embodiments of the inventive concept. FIG. 5 is a diagram of a data state graph based on which the first FSM 214 and the second FSM 234 determine a data state, according to other embodiments of the inventive concept. FIG. 6 is a diagram of a data state graph based on which the first FSM 214 and the second FSM 234 determine a data state, according to other embodiments of the inventive concept.

Referring to FIGS. 4 through 6, the first FSM 214 and the second FSM 234 determine a data state. In the exemplary embodiments illustrated in FIGS. 4 through 6, it is assumed that the pattern transformer 210 and the pattern de-transformer 230 receive and process quaternary data in the quaternary numeral system. For the sake of convenience of explanation, operation of only the first FSM 214 with respect to the data state will be described, although the description likewise applies to the operation of the FSM 234.

FIG. 4 illustrates the data state graph for avoiding a forbidden pattern of 3-0-3. Here, S1, S2, and S3 denote data states. Each of the data states S1 through S3 may be shifted to another data state according to the input stream IS temporarily stored in the first main buffer 212 or a mapped alphabet letter 0, 1, 2, or 3.

When the data state is S1 and the alphabet letter stored in the first main buffer 212 is 0, 1, or 2, the data state remains in S1. When data state is S1 and the alphabet letter stored in the first main buffer 212 is 3, the data state is shifted from S1 to S2. When the data state is S2 and the alphabet letter stored in the first main buffer 212 is 1 or 2, the data state is shifted from S2 to S1. When the data state is S2 and the alphabet letter stored in the first main buffer 212 is 3, the data state remains in S2. When the data state is S2 and the alphabet letter stored in the first main buffer 212 is 0, the data state is shifted from S2 to S3. When the data state is S3 and the alphabet letter stored in the first main buffer 212 is 0, 1, or 2, the data state is shifted from S3 to S1.

Consequently, when the data state is S3, the alphabet letter stored in the first main buffer 212 cannot be 3. This is to avoid the forbidden pattern of 3-0-3. In other words, S3 may be defined as a "first state" in which at least one alphabet letter (e.g., "3" in the depicted example) among a plurality of alphabet letters "0", "1", "2", and "3" cannot be output according to the input stream IS including the alphabet letters "0", "1", "2", and "3" or the mapped alphabet letters. S1 and S2 may be defined as a "second state" in which all of the alphabet letters (e.g., "0", "1", "2", and "3" in the depicted example) can be output according to the input stream IS including the alphabet letters "0", "1", "2", and "3" or the mapped alphabet letters.

When a current data state is shifted to the first state according to the alphabet letters included in the input stream IS, the first FSM 214 controls the first base converter 218 to convert a part corresponding to a conversion size in the input stream IS into a string over a lower numeral system and to insert the string into the input stream IS. When there is a base-converted alphabet letter in the first sub buffer 216, the first main buffer 212 receives the base-converted alphabet letter from the first sub buffer 216 through the first mapper 220 and inserts the base-converted alphabet letter into the input stream IS under control of the first FSM 214. When the base-converted alphabet letter cannot be output in a current data state, the first FSM 214 controls the first mapper 220 to map the base-converted alphabet letter to another alphabet letter.

When the current data state is shifted to the second state according to the input stream IS or the mapped alphabet letters, the first FSM 214 controls the first main buffer 212 to output the alphabet letter as it is.

FIG. 5 illustrates the data state graph for avoiding a forbidden pattern of 2-2. Here, S1 and S2 denote data states. Each of the data states S1 and S2 may be shifted to another data state according to the input stream IS temporarily stored in the first main buffer 212 or a base-converted alphabet letter 0, 1, 2, or 3.

When the data state is S1 and the alphabet letter stored in the first main buffer 212 is 0, 1, or 3, the data state remains in S1. When the data state is S1 and the alphabet letter stored in the first main buffer 212 is 2, the data state is shifted from S1 to S2. When the data state is S2 and the alphabet letter stored in the first main buffer 212 is 0, 1, or 3, the data state is shifted from S2 to S1.

Consequently, the alphabet letter stored in the first main buffer 212 when the data state is S2 cannot be 2. This is to avoid the forbidden pattern of 2-2. Accordingly, the data state S1 corresponds to the second state and the data state S2 corresponds to the first state. The control operation of the first FSM 214 in the embodiments illustrated in FIG. 5 is substantially the same as that described above with reference to FIG. 4. Thus, descriptions thereof will not be repeated.

FIG. 6 illustrates the data state graph for avoiding the forbidden patterns of 3-0-3 and 2-2. Thus, the data state graph illustrated in FIG. 6 is essentially a combination of the content of the data state graph illustrated FIG. 4 and the content of the data state graph illustrated in FIG. 5.

In FIG. 6, S3 and S4 correspond to the first state and S1 and S2 correspond to the second state. The control operation of the first FSM 214 in the embodiments illustrated in FIG. 6 is substantially the same as that described above with reference to FIGS. 4 and 5. Thus, descriptions thereof will not be repeated.

When the first FSM 214 operates according to the data state graph illustrated in FIG. 6, a method by which the first FSM 214 determines a conversion size of the part of the input stream IS that will be converted into a string in a lower numeral system by the first base converter 218 will be described below. This method may also be used in the embodiments illustrated in FIGS. 4 and 5.

An adjacent matrix of the data state graph illustrated in FIG. 6 may be expressed by Equation (1):

$$A = \begin{bmatrix} 2 & 1 & 0 & 1 \\ 1 & 1 & 1 & 1 \\ 2 & 0 & 0 & 1 \\ 2 & 1 & 0 & 0 \end{bmatrix} \quad (1)$$

Each of the rows and columns of the adjacent matrix corresponds to a data state. A value of an element defined by a particular row and a particular column denotes the number of alphabet letters that can be moved from a data state corresponding to the row to a data state corresponding to the column. For instance, the value "2" of the element $a_{11}$ in the first row and the first column denotes the number of alphabet letters "0" and "1" that can be moved from the data state S1 to the data state S1. The value "1" of the element $a_{34}$ in the third row and the fourth column denotes the number of alphabet letter "2" that can be moved from the data state S3 to the data state S4.

A probability-transition matrix obtained when a probability is considered in the adjacent matrix of the data state graph illustrated in FIG. 6 may be expressed by Equation (2):

$$Q = \begin{bmatrix} 2/4 & 1/4 & 0 & 1/4 \\ 1/4 & 1/4 & 1/4 & 1/4 \\ 2/3 & 0 & 0 & 1/3 \\ 2/3 & 1/3 & 0 & 0 \end{bmatrix} \quad (2)$$

Each of the rows and columns of the probability-transition matrix corresponds to a data state. A value of an element defined by a particular row and a particular column denotes a ratio of the number of alphabet letters that can be moved from a data state corresponding to the row to a data state corresponding to the column to the total number of alphabet letters that can be moved from the data state corresponding to the row to any one of the data states. For instance, the value "2/4" of the element $q_{11}$ in the first row and the first column denotes the ratio of the number of alphabet letters "0" and "1" that can be moved from the data state S1 to the data state S1 to the total number of alphabet letters "0", "1", "2", and "3" that can be moved from the data state S1 to any one of the data states S1 through S4. The value "1/3" of the element $q_{34}$ in the third row and the fourth column denotes the ratio of the number of alphabet letters "2" that can be moved from the data state S3 to the data state S4 to the total number of alphabet letters "0", "1", and "2" that can be moved from the data state S3 to any one of the data states S1 through S4.

When a stationary probability vector giving $\pi Q = \pi$ is obtained with respect to the probability-transition matrix Q, $\pi$ is defined as Equation (3):

$$\pi = [P1, P2, P3, P4] = \left[\frac{92}{191}, \frac{48}{191}, \frac{12}{191}, \frac{39}{191}\right] \quad (3)$$

Each element of the stationary probability vector indicates a probability of the occurrence of a data state with no consideration of a previous data state. In other words, when the previous data state is not considered, a probability P1, P2, P3, or P4 of the occurrence of each of the data states S1, S2, S3, and S4 is 92/191, 48/191, 12/191, and 39/191, respectively.

A conversion size $k_j$ may be expressed by Equation (4):

$$k_j = N \frac{q_j \log_m j}{\sum_{i=2}^{m} q_i \log_m i} \quad (4)$$

In Equation (4), N is the total size (e.g., 10,000 when the input stream IS is 10,000 bits in length) of the input stream IS, "m" is a value (e.g., 4 when the input stream IS is quaternary data) corresponding to a numeral system in which the input stream IS is represented, "j" is a value (e.g., 3) corresponding to a numeral system (e.g., a ternary numeral system when the input stream IS is quaternary data) into which the input stream IS is converted, and "i" is at least 2 and does not exceed (m−1).

In Equation 4, $q_j$ may be defined as Equation (5):

$$q_j = \sum_{v \in V, |S_v|=j} P_v \quad (5)$$

In Equation (5), V is a set of serial numbers respectively corresponding to all data states, "v" is a number (e.g., 1, 2, 3, or 4 in FIG. 6) corresponding to each of the data states, i.e., an element of the set V, $|S_v|$ is the maximum number of alphabet letters that can be output in a current data state. For instance, when j=3 as shown in FIG. 6, $q_3$ is the sum of the elements of the stationary probability vector giving $|S_v|$=3, i.e., 12/191+ 39/191=51/191.

When N=10,000, j=3 as shown in FIG. 6, and m=4 in Equation (4), $k_3$ can be calculated as shown in Equation (6):

$$k_3 = 10000 * \frac{\left(\frac{12}{191} + \frac{39}{191}\right) * \log_4 3}{\left(\frac{92}{191} * \log_4 4 + \frac{48}{191} * \log_4 4 + \frac{12}{191} * \log_4 3 + \frac{39}{191} * \log_4 3\right)}. \quad (6)$$

Consequently, $k_3$ is 2240.18 (that is about 2241). This means that the first base converter 218 performs base conversion on 2241 alphabet letters. The first base converter 218 may convert 2241 alphabet letters at once or over several times.

The total number of alphabet letters finally output from the pattern transformer 210 through the base conversion of the first base converter 218 may be calculated using Equation (7):

$$N_o = N \frac{1}{\sum_{i=2}^{m} q_i \log_m i}. \quad (7)$$

In the above-described example, the total number of alphabet letters output from the pattern transformer 210 is 10586.6 (that is, about 10587). This agrees with the number of alphabet letters when the first base converter 218 converts 2241 letters from the quaternary numeral system into ternary numeral system. The number of ternary numeral system alphabet letters is 2827 and an increment in the number of alphabet letters is 587 (that is, 2827-2241). In other words, an increment in the number of alphabet letters through the operation for avoiding a forbidden pattern is about 587.

FIG. 7 is a diagram for explaining operations of the first mapper 220 and the second mapper 236 when the data state is determined based on the data state graph illustrated in FIG. 4, for example. FIG. 8 is a diagram for explaining operations of the first mapper 220 and the second mapper 236 when the data state is determined based on the data state graph illustrated in FIG. 5, for example. FIG. 9 is a diagram for explaining operations of the first mapper 220 and the second mapper 236 when the data state is determined based on the data state graph illustrated in FIG. 6, for example.

Referring to FIGS. 7 through 9, when the first FSM 214 determines that the data state is the first state, the first FSM 214 receives a base-converted alphabet letter from the first sub buffer 216 and inserts it into the input stream IS. At this time, when the base-converted alphabet letter is a letter that cannot be output in the current data state, the first FSM 214 controls the first mapper 220 to map the base-converted alphabet letter to a different alphabet letter. However, when the base-converted alphabet letter is a letter that can be output in the current data state, the first FSM 214 controls the first mapper 220 to map the base-converted alphabet letter to the same alphabet letter.

Referring to FIG. 7, the first mapper 220 does not map the base-converted alphabet letter to a different alphabet letter in the data state S3 corresponding to the first state. In other words, since no base-converted alphabet letter is 3, the first mapper 220 does not need to map the base-converted alphabet letter to a different alphabet letter to avoid the forbidden pattern of 3-0-3.

Differently, referring to FIG. 8, when the base-converted alphabet letter is 2 in the data state S2 corresponding to the first state, the first mapper 220 may map 2 to 3 in order to avoid the forbidden pattern of 2-2. In other words, since the pattern transformer 210 cannot output the alphabet letter 2 in the data state S2, the first mapper 220 maps the alphabet letter 2 to the alphabet letter 3 to avoid the forbidden pattern of 2-2.

Referring to FIG. 9, when the base-converted alphabet letter is 2 in the data state S4 corresponding to the first state, the first mapper 220 may map 2 to 3. In other words, since the pattern transformer 210 cannot output the alphabet letter 2 in the data state S4, the first mapper 220 maps the alphabet letter 2 to the alphabet letter 3 to avoid the forbidden pattern of 2-2.

The second mapper 236 included in the pattern de-transformer 230 may perform reverse mapping to the mapping performed by the first mapper 220 described above with reference to FIGS. 7 through 9. In other words, when the first mapper 220 maps the base-converted alphabet letter to the same alphabet letter (e.g., 2 to 2), the second mapper 236 also maps the base-converted alphabet letter to the same alphabet letter. However, when the first mapper 220 maps the base-converted alphabet letter to a different alphabet letter (e.g., 2 to 3), the second mapper 236 performs reverse mapping (e.g., 3 to 2).

FIGS. 10A through 10C are diagrams for explaining operation of the pattern transformer 210 when the data state is determined based on the data state graph illustrated in FIG. 6, for example. Referring to FIGS. 1 through 3, FIGS. 6 and 9, and FIGS. 10A through 10C, an input time is a time at which each of alphabet letters (i.e., input alphabet letters) included in the input stream IS is input from the host 50 into the pattern transformer 210. The input time may be determined depending on the operating speed of the host 50. An output time is a time at which the pattern transformer 210 outputs each of the alphabet letters (i.e., output alphabet letters) included in the pattern-transformed input stream IS. The output time may be determined by control logic (not shown) included in the memory controller 200.

An output time may come after an input time in the same place as the output time in a sequence and before an input time in the next place in the sequence. For instance, an input alphabet letter of 2 may be input to the pattern transformer 210 at the second input time, and the alphabet letter of 2 may be output from the pattern transformer 210 at the second output time after a predetermined period of time. Thereafter, an input alphabet letter of 3 may be input to the pattern transformer 210 at the third input time.

A pre-output buffer state may indicate the state of the first sub buffer 216 between an input time and an output time in the same place as the input time in the sequence. A post-output buffer state may indicate the state of the first sub buffer 216 between the output time and an input time in the place next to the output time in the sequence.

Referring to FIGS. 10A through 10C, in the exemplary operation of the pattern transformer 210, the data state is an initial state at the first input time. The initial state may be set to a random data state. For instance, the initial state is assumed to be the data state S1, for example.

An alphabet letter of 1 is input to the pattern transformer 210 at the first input time and is temporarily stored in the first main buffer 212. Since the data state is the second state (S1), the first FSM 214 outputs the alphabet letter of 1 as it is. The first FSM 214 may determine the data state to be S1 based on the alphabet letter of 1.

An alphabet letter of 2 is input to the pattern transformer 210 at the second input time and is temporarily stored in the first main buffer 212. Since the data state is the second state (S1), the first FSM 214 outputs the alphabet letter of 2 as it is. The first FSM 214 determines the data state to be S4 based on the alphabet letter of 2, as indicated in FIG. 6.

An alphabet letter of 3 is input to the pattern transformer 210 at the third input time and is temporarily stored in the first main buffer 212. Since the data state is the first state (S4) and there is no alphabet letter in the first sub buffer 216, a string of alphabet letters corresponding to a conversion size among the alphabet letters included in the input stream IS is transmitted to the first base converter 218. When the conversion size is 19, for example, the first FSM 214 may transmit 19 alphabet letters respectively input at the third through twenty-first input times to the first base converter 218 through the first sub buffer 216.

The first base converter 218 converts the 19 quaternary alphabet letters (i.e., 3, 0, 3, 0, 0, 0, 0, 0, 0, 0, 0, 0, 0, 0, 0, 0, 0, 0, 0) into 24 ternary alphabet letters (i.e., 2, 0, 2, 2, 2, 1, 1, 0, 1, 1, 1, 1, 2, 0, 0, 0, 1, 2, 0, 0, 2, 1, 2, 0). The 24 ternary alphabet letters are stored in the first sub buffer 216, and the first alphabet letter 2 is transmitted to the first mapper 220.

Since the base-converted alphabet letter 2 cannot be output in the current data state S4, the first FSM 214 controls the first mapper 220 to map 2 to 3, for example. The first mapper 220 outputs the alphabet letter 3, and the first FSM 214 determines the data state to be S2 based on the alphabet letter 3 stored in the first main buffer 212.

An alphabet letter of 0 is input to the pattern transformer 210 at the twenty-second input time and is temporarily stored in the first main buffer 212. Since the data state is the second state, the first FSM 214 outputs the alphabet letter 0 as it is. The first FSM 214 determines the data state to be S3 based on the alphabet letter 0.

Twenty-three ternary alphabet letters (i.e., 0, 2, 2, 2, 1, 1, 0, 1, 1, 1, 1, 2, 0, 0, 0, 1, 2, 0, 0, 2, 1, 2, 0) are in the first sub buffer 216, and the first alphabet letter 0 is transmitted to the first mapper 220. Since the base-converted alphabet letter 0 can be output in the current data state S3, the first FSM 214 controls the first mapper 220 to map 0 to 0. The first mapper 220 outputs the alphabet letter 0, and the first FSM 214 determines the data state to be S1 based on the alphabet letter 0 stored in the first main buffer 212.

Alphabet letters input to the pattern transformer 210 at the twenty-third through twenty-fifth input times are 0, 3, and 1, and therefore the data state is not converted to the first state. As a result, the input alphabet letters 0, 3, and 1 are output unchanged.

An alphabet letter of 2 is input to the pattern transformer 210 at the twenty-sixth input time and is temporarily stored in the first main buffer 212. Since the data state is the second state (S1), the first FSM 214 outputs the alphabet letter 2 as it is. The first FSM 214 determines the data state to be S4 based on the alphabet letter 2.

Twenty-two ternary alphabet letters (i.e., 2, 2, 2, 1, 1, 0, 1, 1, 1, 1, 2, 0, 0, 0, 1, 2, 0, 0, 2, 1, 2, 0) are in the first sub buffer 216 and the first alphabet letter 2 is transmitted to the first mapper 220. Since the base-converted alphabet letter 2 cannot be output in the current data state S4, the first FSM 214 controls the first mapper 220 to map 2 to 3. The first mapper 220 outputs the alphabet letter 3, and the first FSM 214 determines the data state to be S2 based on the alphabet letter 3 stored in the first main buffer 212.

An alphabet letter input to the pattern transformer 210 at the twenty-seventh input time is 3, and therefore, the data state is not converted to the first state. As a result, the input alphabet letter 3 is output unchanged and the data state is maintained at S2.

An alphabet letter of 0 is input to the pattern transformer 210 at the twenty-eighth input time and is temporarily stored in the first main buffer 212. Since the data state is the second state (S2), the first FSM 214 output the alphabet letter 0 as it is. The first FSM 214 determines the data state to be S3 based on the alphabet letter 0.

Twenty-one ternary alphabet letters (i.e., 2, 2, 1, 1, 0, 1, 1, 1, 1, 2, 0, 0, 0, 1, 2, 0, 0, 2, 1, 2, 0) are in the first sub buffer 216 and the first alphabet letter 2 is transmitted to the first mapper 220. Since the base-converted alphabet letter 2 can be output in the current data state S3, the first FSM 214 controls the first mapper 220 to map 2 to 2. The first mapper 220 outputs the alphabet letter 2, and the first FSM 214 determines the data state to be S4 based on the alphabet letter 2 stored in the first main buffer 212.

Twenty ternary alphabet letters (i.e., 2, 1, 1, 0, 1, 1, 1, 1, 2, 0, 0, 0, 1, 2, 0, 0, 2, 1, 2, 0) are in the first sub buffer 216 and the first alphabet letter 2 is transmitted to the first mapper 220. Since the base-converted alphabet letter 2 cannot be output in the current data state S4, the first FSM 214 controls the first mapper 220 to map 2 to 3. The first mapper 220 outputs the alphabet letter 3, and the first FSM 214 determines the data state to be S2 based on the alphabet letter 3 stored in the first main buffer 212.

Thereafter, from the thirtieth input time to the thirty-ninth input time the pattern transformer 210 repeats a procedure for determining the current data state and outputting a pattern-transformed alphabet letter according to the determined data state.

An alphabet letter of 2 is input to the pattern transformer 210 at the fortieth input time and is temporarily stored in the first main buffer 212. Since the data state is the second state (S1), the first FSM 214 outputs the alphabet letter 2 as it is. The first FSM 214 determines the data state to be S4 based on the alphabet letter 2.

Since there is no input stream IS after the fortieth input time, 14 ternary alphabet letters (i.e., 1, 1, 2, 0, 0, 0, 1, 2, 0, 0, 2, 1, 2, 0) stored in the first sub buffer 216 are sequentially output through the first mapper 220 and the first main buffer 212.

Although the operation of the pattern transformer 210 only has been described with reference to FIGS. 10A through 10C, since the operation of the pattern de-transformer 230 is performed in reverse order from the operation of the pattern transformer 210, the description thereof will be omitted.

Figure 11:
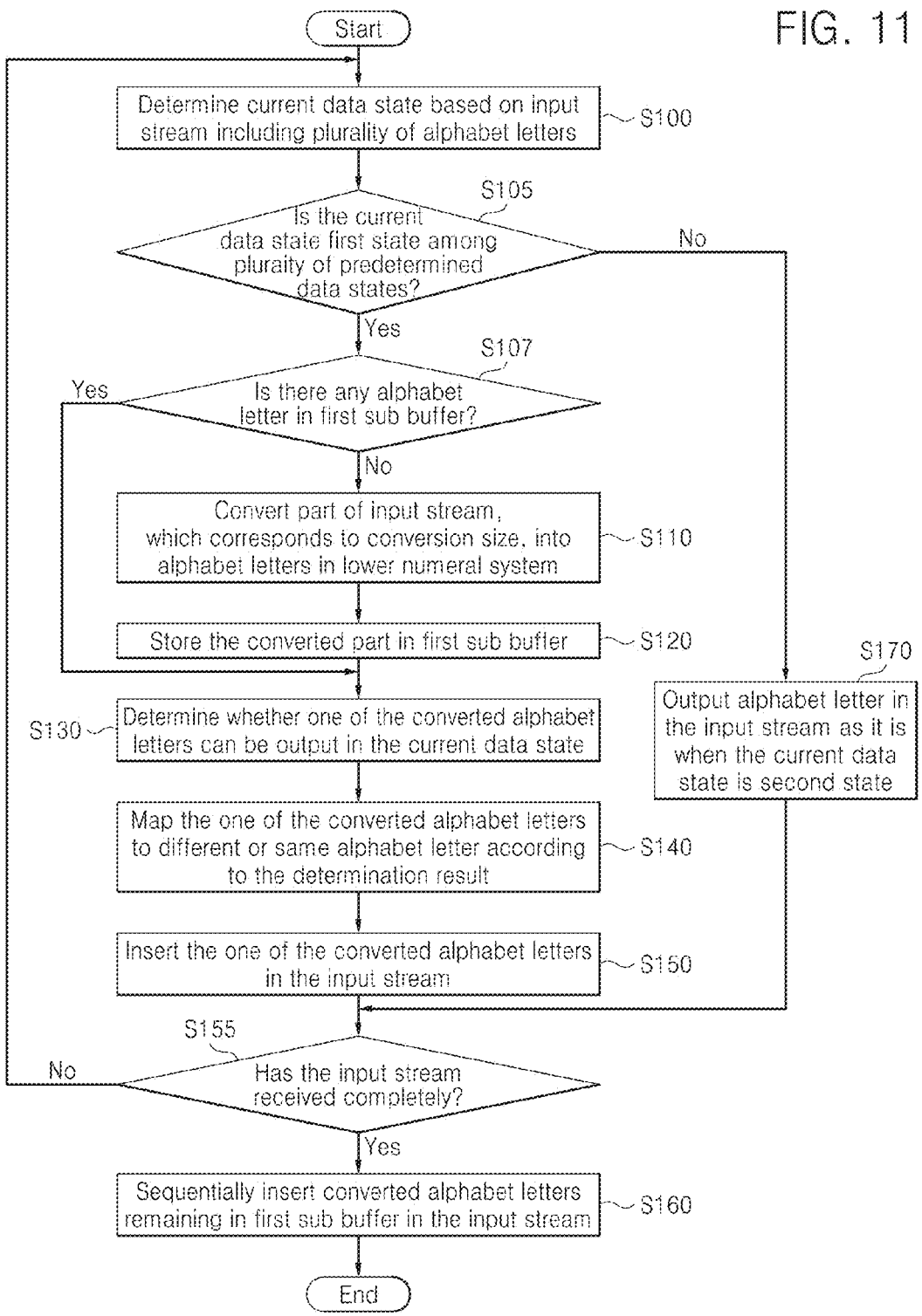
FIG. 11 is a flowchart of operations of the pattern transformer illustrated in FIG. 2, according to an embodiment of the inventive concept.

FIG. 11 is a flowchart of the operations of the pattern transformer 210 illustrated in FIG. 2. Referring to FIGS. 1, 2, 6, 9, 10A through 10C, and 11, the first main buffer 212 receive the input stream IS including a plurality of alphabet letters from the host 50. The first FSM 214 determines a current data state (e.g., first or second current state) based on a current one of the alphabet letters included in the input stream IS in operation S100.

When the current data state is determined to be the first state (e.g., S3 or S4 in FIG. 6) among a plurality of predetermined data states based on the input stream IS in operation S105, the first FSM 214 determines whether there is any base-converted alphabet letter in the first sub buffer 216 in operation S107. When it is determined that there is no base-converted alphabet letter in the first sub buffer 216 in operation S107, the first base converter 218 converts a part of the input stream IS, which corresponds to the conversion size, into alphabet letters in a lower numeral system in operation S110. When it is determined that there is any base-converted alphabet letter in the first sub buffer 216 in operation S107, the process proceeds to operation S130, discussed below.

The first sub buffer 216 stores the base-converted alphabet letters received from the first base converter 218 in operation S120. The first FSM 214 determines whether one of the base-converted alphabet letters stored in the first sub buffer 216 can be output in the current data state in operation S130.

When it is determined that the one base-converted alphabet letter can not be output in the current data state, the first mapper 220 maps the one base-converted alphabet letter to a different alphabet letter in operation S140. For instance, when the one base-converted alphabet letter is 2 in the data state S4 in FIG. 6, the first FSM 214 controls the first mapper 220 to map the alphabet letter 2 to alphabet letter 3. When it is determined that the one base-converted alphabet letter can be output in the current data state, the first mapper 220 maps the one base-converted alphabet letter to the same alphabet letter in operation S140. After being mapped, the one base-converted alphabet letter may be inserted by the first main buffer 212 in the input stream IS in operation S150.

The first FSM 214 determines whether the input stream IS has been completely received from the host 50 in operation S155. When it is determined that the input stream IS has not been completely received in operation S155, the pattern transformer 210 returns to operation S100. When it is determined that the input stream IS has been completely received in operation S155, the first FSM 214 sequentially receives and inserts the base-converted alphabet letters remaining in the first sub buffer 216 into the input stream IS at the end of the input stream IS in operation S160.

When the current data state is determined to be the second state (e.g., S1 or S2 in FIG. 6) among the plurality of predetermined data states based on the input stream IS in operation S105, the current alphabet letter in the input stream IS may be output as it is in operation S170.

Figure 12:
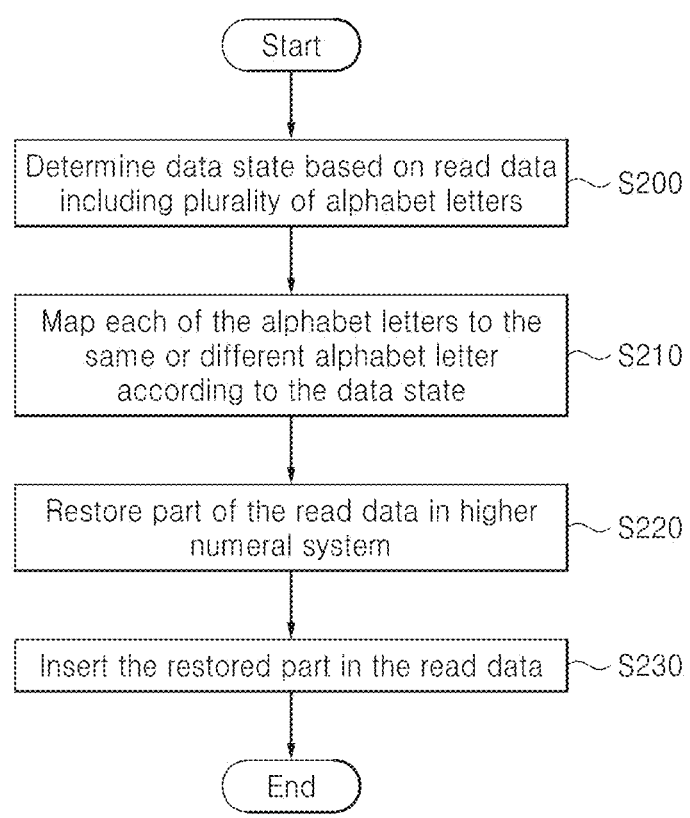
FIG. 12 is a flowchart of operations of the pattern de-transformer illustrated in FIG. 3, according to an embodiment of the inventive concept.

FIG. 12 is a flowchart of the operations of the pattern de-transformer 230 illustrated in FIG. 3. Referring to FIGS. 1, 3, 6, 9, and 10A through 12, the second main buffer 232 receives and temporarily stores the read data RD including a plurality of alphabet letters ECC decoded by the ECC decoder 270. The second FSM 234 determines a current data state based on a current alphabet letter included in the read data RD in operation S200.

When the second sub buffer 238 is empty, the second main buffer 232 transmits the current alphabet letter to the second mapper 236 and may simultaneously store the next alphabet letter of the read data RD with a space corresponding to the conversion size being empty under control of the second FSM 234. The second FSM 234 controls the alphabet letter received by the second mapper 236 to be mapped to the same or a different alphabet letter based on the current data state and the mapping information shared with the first FSM 214 in operation S210.

The second base converter 240 receives mapped alphabet letters one by one until receiving all of alphabet letters in a string, into which a string corresponding to the conversion size has been converted by the first base converter 218 (for example, 24 letters in a string over the ternary alphabet into which 19 letters in a string corresponding to a conversion size of 19 over the quaternary alphabet are converted). The second base converter 240 restores alphabet letters in a higher numeral system from the received alphabet letters in a lower numeral system in operation S220.

The second main buffer 232 receives the restored alphabet letters from the second base converter 240 through the second sub buffer 238, and inserts restored alphabet letters into the empty space under control of the second FSM 234 in operation S230.

Although the description of the operations of the second FSM 234 is simpler than that of the operations of the first FSM 214, the operations of the second FSM 234 are essentially the reverse of the operations of the first FSM 214.

Figure 13:
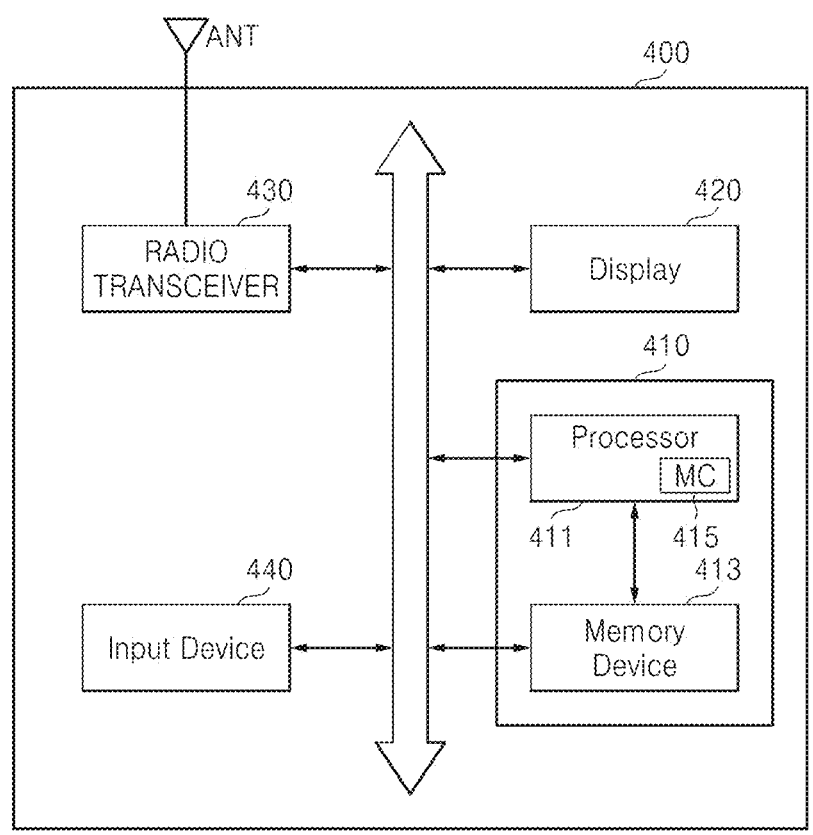
FIG. 13 is a block diagram of a system including an example of the memory system of FIG. 1, according to an embodiment of the inventive concept.

FIG. 13 is a block diagram of a system 400 including an example of the memory system 100 of FIG. 1, according to an embodiment of the inventive concept.

Referring to FIGS. 1 and 13, the system 400 may be embodied as an electronic device or a portable device. The portable device may be a cellular phone, a smart phone, or a tablet PC, for example.

The system 400 includes a memory system 410 having a processor 411 and a memory device 413. The memory device 413 may be implemented as the memory device 150 of FIG. 1, for example. In an embodiment, the processor 411 and the memory device 413 may be packaged in a semiconductor package. In this case, the semiconductor package may be mounted on a system board (not shown).

The processor 411 includes a memory controller 415 configured to control data processing operations (e.g., write operation and/or read operations) of the memory device 413. The memory controller 415 may be the memory controller 200 of FIG. 1, for example. The memory controller 415 is controlled by the processor 411 configured to control overall operations of the system 400. In an embodiment, the memory controller 415 may be connected between the processor 411 and the memory device 413. Data stored in the memory device 413 may be displayed on a display unit 420 under control of the processor 411.

A radio transceiver 430 may transmit and/or receive radio signals via an antenna ANT. For example, the radio transceiver 430 may transform the radio signal received via the antenna ANT into a signal to be processed by the processor 411. Thus, the processor 411 may process a signal output from the radio transceiver 430, and store the processed signal in the memory device 413 and/or display the processed signal on the display unit 420. Also, the radio transceiver 430 may transform a signal output from the processor 411 into a radio signal, and output the radio signal to the outside via the antenna ANT.

The system 400 further includes an input device 440 by which control signals for controlling operations of the processor 411 and data to be processed by the processor 411 are input. The input device 440 may be embodied as a pointing device, for example, such as a touch pad and a computer mouse, or a keyboard.

The processor 411 may control the display unit 420 to display data output from the memory device 413, radio signals output from the radio transceiver 430, and/or data output from the input device 440. The various components may communicate via a bus.

Figure 14:
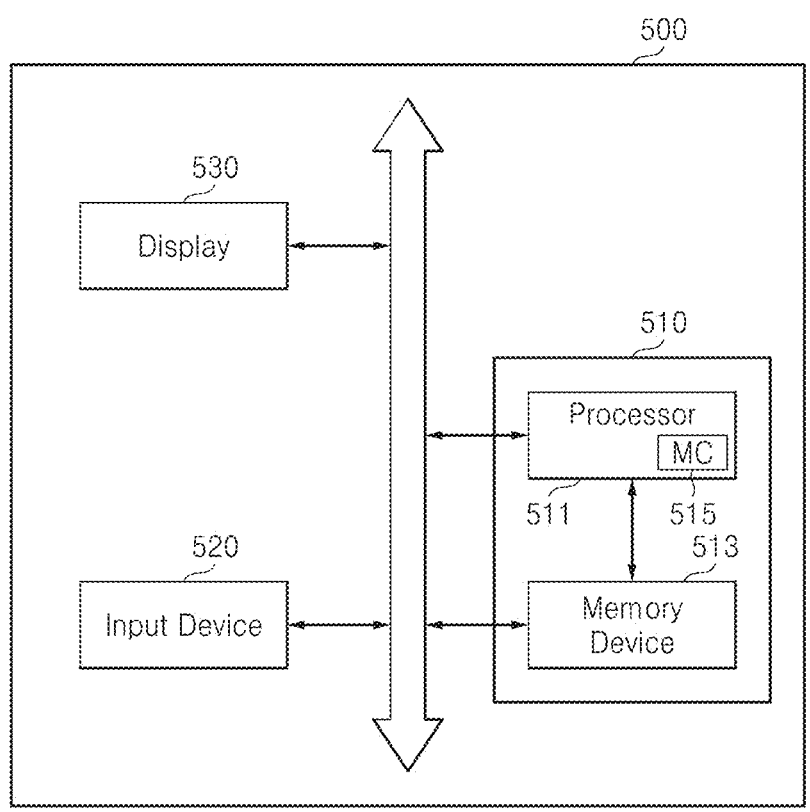
FIG. 14 is a block diagram of a system including an example of the memory system of FIG. 1, according to another embodiment of the inventive concept.

FIG. 14 is a block diagram of a system 500 including an example of the memory system 100 of FIG. 1, according to another embodiment of the inventive concept. Referring to FIGS. 1 and 14, the system 500 may be embodied as a PC, a tablet PC, a net-book, an e-reader, a personal digital assistant (PDA), a portable multimedia player (PMP), an MP3 player, or an MP4 player, for example.

The system 500 includes a memory system 510 having a processor 511 and a memory device 513. The processor 511 is configured to control overall operations of the system 500. The memory device 513 may be implemented as the memory device 150 of FIG. 1, for example. In an embodiment, the memory device 513 may be packaged in a semiconductor package. The semiconductor package may be mounted on a system board (not shown).

The processor 511 may include a memory controller 515 configured to control an operation of the memory device 513. The memory controller 515 may be implemented as the memory controller 200 of FIG. 1, for example. The processor 511 may display data stored in the memory device 513 on a display unit 530 according to an input signal generated by an input device 520. The input device 520 may be embodied as a pointing device, for example, such as a touch pad or a computer mouse, a keypad, or a keyboard. The various components may communicate via a bus.

Figure 15:
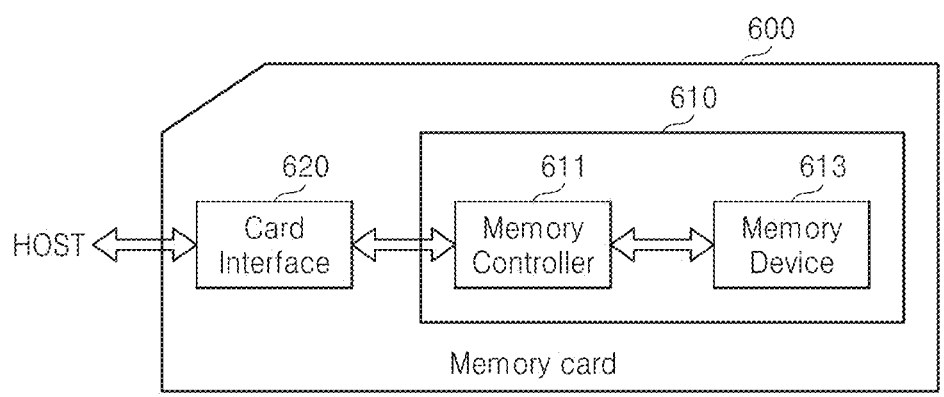
FIG. 15 is a block diagram of a system including an example of the memory system of FIG. 1, according to another embodiment of the inventive concept.

FIG. 15 is a block diagram of a system 600 including an example of the memory system 100 of FIG. 1, according to another embodiment of the inventive concept. Referring to FIGS. 1 and 15, the system 600 may be embodied as a memory card or a smart card, for example.

The system 600 includes a memory system 610 having a memory controller 611 and a memory device 613. The system 600 further includes a card interface 620. The memory device 613 may be implemented as the memory device 150 of FIG. 1, for example. The memory controller 611 may control exchange of data between the memory device 613 and the card interface 620. The memory controller 611 may be implemented as the memory controller 200 of FIG. 1, for example. In an embodiment, the memory device 613 may be packaged in a semiconductor package. The semiconductor package may be mounted on a system board (not shown).

In an embodiment, the card interface 620 may be a secure digital (SD) card interface or a multi-media card (MMC) interface, although the inventive concept is not limited thereto. The card interface 620 may interface exchange of data between a host and the memory controller 611 according to a protocol from the host.

When the system 600 is connected to the host, such as a computer, a digital camera, a digital audio player, a cellular phone, console video game hardware, or a digital set-top box, for example, the host may exchange data stored in the memory device 613 with the card interface 620 via the memory controller 611. The various components may communicate via a bus.

Figure 16:
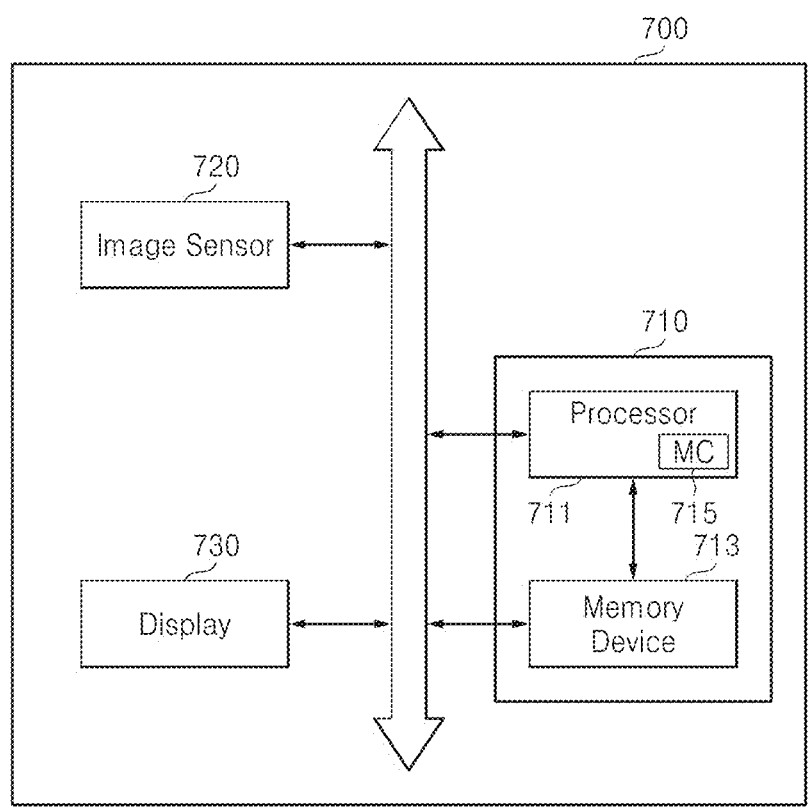
FIG. 16 is a block diagram of a system including an example of the memory system of FIG. 1, according to another embodiment of the inventive concept.

FIG. 16 is a block diagram of a system 700 including an example of the memory system 100 of FIG. 1, according to another embodiment of the inventive concept. Referring to FIGS. 1 and 16, the system 700 may be embodied as a digital camera or a portable device with a built-in digital camera, for example.

The system 700 includes a memory system 710 having a processor 711 and a memory device 713. The processor 711 is configured to control overall operations of the system 700. Also, the processor 711 may include a memory controller 715 configured to control operations of the memory device 713. The memory controller 715 may be implemented as the memory controller 200 of FIG. 1, and the memory device 713 may be implemented as the memory device 150 of FIG. 1, for example. In an embodiment, the processor 711 and the memory device 713 may be packaged in a semiconductor package. The semiconductor package may be mounted on a system board (not shown).

An image sensor 720 of the system 700 transforms an optical image into a digital signal. The digital signal is stored in the memory device 713 and/or is displayed on a display unit 730, under control of the processor 711. The digital signal stored in the memory device 713 may be displayed on the display unit 730 under control of the processor 711. The various components may communicate via a bus.

Figure 17:
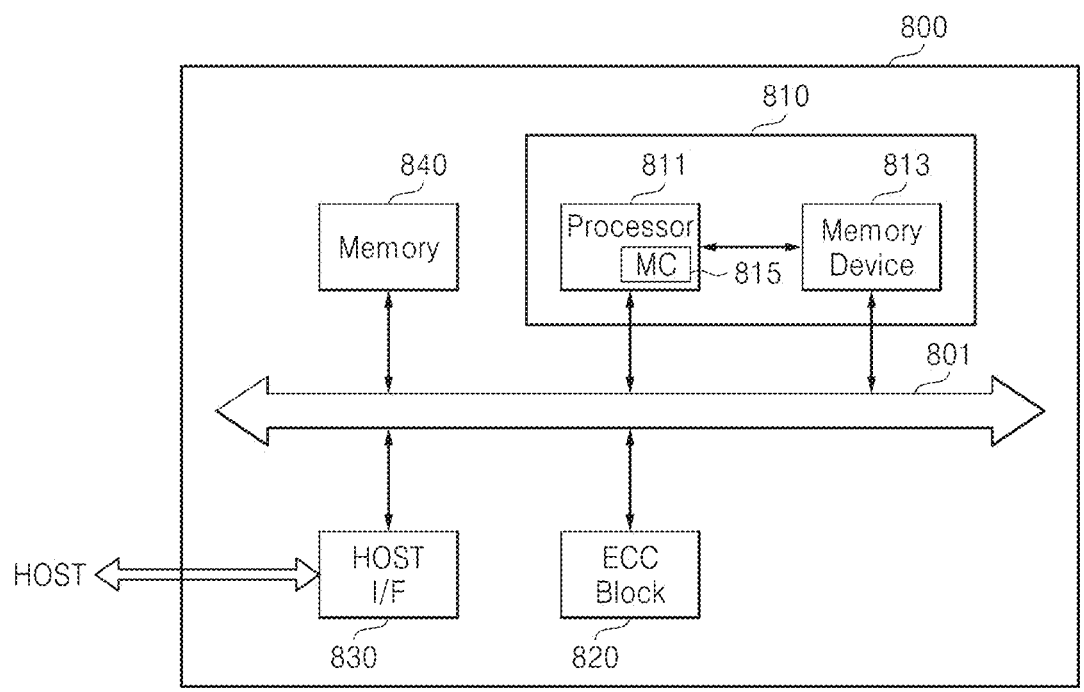
FIG. 17 is a block diagram of a system including an example of the memory system of FIG. 1, according to another embodiment of the inventive concept.

FIG. 17 is a block diagram of a system 800 including an example of the memory system 100 of FIG. 1, according to another embodiment of the inventive concept. Referring to FIGS. 1 and 17, the system 800 may be embodied as a universal serial bus (USB) memory drive or a memory stick, for example.

The system 800 includes a memory system 810 having a processor controller 811 and a memory device 813. The processor 811 is configured to control overall operations of the system 800. Also, the processor 811 may include a memory controller 815 configured to control an operation of the memory device 813. The memory controller 815 may be implemented as the memory controller 200 of FIG. 1, and the memory device 813 may be implemented as the memory device 150 of FIG. 1, for example.

In an embodiment, the memory device 813 and the processor 811 may be packaged in a semiconductor package. The semiconductor package may be mounted on a system board (not shown).

The system 800 further includes a memory 840 that may be used as an operation memory of the processor 811. The memory 840 may be embodied as a non-volatile memory, such as read only memory (ROM) or flash memory, for example.

A host connected to the system 800 may exchange data stored in the memory device 813 with the processor 811 via a host interface 830. In this case, the memory controller 815 may also perform functions of a memory interface.

In an embodiment, the system 800 further includes an ECC block 820. The ECC block 820 operates under control of the processor 811, and detects and corrects errors in data read from the memory device 813 by the memory controller 815. The processor 811 may control exchange of data among the ECC block 820, the host interface 830, and the memory 840 via a bus 801.

Figure 18:
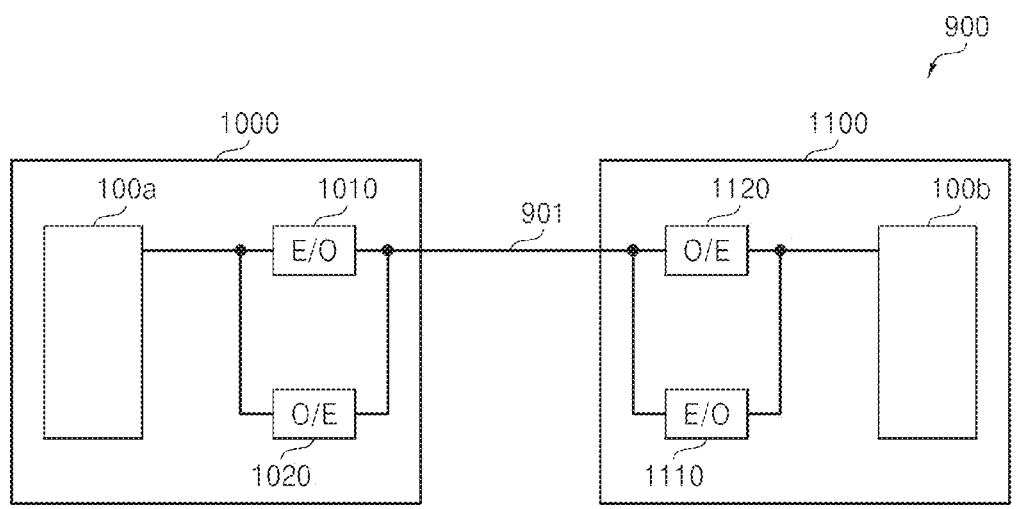
FIG. 18 is a block diagram of a system including an example of the memory system of FIG. 1, according to another embodiment of the inventive concept.

FIG. 18 is a block diagram of a system 900 including examples of the memory system 100 of FIG. 1, according to another embodiment of the inventive concept. A channel 901 may be implemented using an optical connector. The optical connector 901 may include optical fiber, an optical waveguide, or a medium by which optical signals are transmitted.

Referring to FIGS. 1 and 18, the system 900 includes a first system 1000 and a second system 1100. The first system 1000 includes a first memory device 100a and an electrical-to-optical (E/O) conversion circuit 1010. The E/O conversion circuit 1010 converts electrical signals output from the first memory device 100a into optical signals, and outputs the optical signals to the second system 1100 via the optical connector 901.

The second system 1100 includes an optical-to-electrical (O/E) conversion circuit 1120 and a second memory device 100b. The O/E conversion circuit 1120 converts optical signals received via the optical connector 901 into an electrical signal, and transmits the electrical signal to the second memory device 100b.

The first system 1000 may further include an O/E conversion circuit 1020, and the second system 1100 may further include an E/O conversion circuit 1110. When the second system 1100 transmits data to the first system 1000, the E/O conversion circuit 1110 converts electrical signals output from the second memory device 100b into optical signals, and outputs the optical signals to the first system 1000 via the optical connector 901. The O/E conversion circuit 1020 converts optical signals received via the optical connector 901 into electrical signals, and transmits the electrical signals to the first memory device 100a. The structures and operations of the respective memory devices 100a and 100b may be substantially the same as those of the memory system 100 of FIG. 1, for example.

Embodiments of the inventive concept may be implemented as computer-readable codes on a computer-readable recording medium. The computer-readable recording medium is any data storage medium that can store data as a program, executable by a computer processor and read by a computer system. Examples of the computer-readable recording medium include read-only memory (ROM), random-access memory (RAM), CD-ROMs, magnetic tapes, floppy disks, and optical data storage devices. The computer-readable recording medium may be non-transitory to the extent it does not consist of transitory propagating signals.

The computer-readable recording medium may also be distributed over network coupled computer systems so that the computer-readable code is stored and executed in a distributed fashion. Also, functional programs, codes, and/or code segments for accomplishing the various embodiments can be determined by programmers.

As described above, according to various embodiments of the inventive concept, a memory controller avoids forbidden patterns that may cause data loss, thereby enhancing data reliability.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a memory controller, the method comprising:
   determining a data state based on an input stream comprising a plurality of alphabet letters;
   converting a part of the input stream, which corresponds to a conversion size, into alphabet letters in a lower numeral system only when the data state is determined to be a first state among a plurality of predetermined data states;
   determining whether one of the converted alphabet letters can be output in the data state determined based on the input stream;
   mapping the one converted alphabet letter to a different alphabet letter according to a result of the determination;
   inserting the input stream and either the one converted alphabet letter or the different alphabet letter into a combined stream; and
   outputting each of the alphabet letters in the input stream only when the data state is determined to be a second state among the predetermined data states.

2. The method of claim 1, further comprising:
   storing the converted alphabet letters in a first sub buffer, wherein
   the part of the input stream is converted into the alphabet letters in the lower numeral system when the first sub buffer is empty.

3. The method of claim 2, further comprising sequentially inserting converted alphabet letters remaining in the first sub buffer into the combined stream when reception of the input stream is completed.

4. The method of claim 1, further comprising:
   determining another data state based on read data comprising another plurality of alphabet letters;
   restoring a part of the read data to a higher numeral system; and
   inserting the restored part and the read data into combined read data.

5. The method of claim 4, further comprising mapping each of the alphabet letters in the read data to a different alphabet letter according to the other data state determined based on the read data.

6. The method of claim 5, wherein a size of the restored part of the read data is the conversion size.

7. The method of claim 1, wherein:
   the first state is one in which at least one of the plurality of alphabet letters cannot be output because the output would create a forbidden output pattern in conjunction with an output of other alphabet letters,
   the second state is one in which all of the plurality of alphabet letters can be output, and
   the conversion size is determined depending on a size of the input stream.

8. A memory controller comprising:
   a pattern transformer configured to:
      convert a part of a first input stream comprising a plurality of alphabet letters from a higher numeral system to a lower numeral system only when a data state is determined to be a first state among a plurality of predetermined data states based on the first input stream,
      determine whether one of the converted alphabet letters can be output,
      map the one converted alphabet letter to a different alphabet letter when the one converted alphabet letter cannot be output, and
      insert into a combined stream the first input stream and either the converted part of the first input stream or the converted part of the first input stream with the one converted alphabet letter replaced by the different alphabet letter; and
   a pattern de-transformer configured to convert a part of read data comprising another plurality of alphabet letters to the higher numeral system only when another data state is determined to be the first state based on the read data, and to insert the converted part of the read data and the read data into combined read data, the read data being obtained by reading a second input stream that has been written to a memory device, wherein
   the first state is one in which at least one of the plurality of alphabet letters cannot be output because the output would create a forbidden output pattern in conjunction with an output of other alphabet letters.

9. The memory controller of claim 8, wherein the pattern transformer comprises:
   a base converter configured to convert the part of the first input stream into the lower numeral system;
   a sub buffer configured to store the converted part;
   a mapper configured to map the one alphabet letter in the converted part to the different alphabet letter when the alphabet letter in the converted part cannot be output in the first state because the output would create a forbidden output pattern in conjunction with an output of other alphabet letters;
   a main buffer configured to store the first input stream and the mapped alphabet letter; and a finite state machine configured to determine the data state based on the first input stream and the mapped alphabet letter, and to control the main buffer and the mapper.

10. The memory controller of claim 9, wherein the part of the input stream has a conversion size.

11. The memory controller of claim 8, wherein the pattern de-transformer comprises:
a mapper configured to map each of the alphabet letters in the read data to a different alphabet letter according to the other data state determined based on the read data;
a sub buffer configured to store the mapped alphabet letters;
a base converter configured to restore alphabet letters to the higher numeral system from the mapped alphabet letters;
a main buffer configured to store the read data and the restored alphabet letters; and
a finite state machine configured to determine the other data state based on the read data, and to control the main buffer and the mapper.

12. The memory controller of claim 11, wherein the number of restored alphabet letters is the same as a conversion size.

13. The memory controller of claim 12, wherein the conversion size is determined depending on a size of the second input stream.

14. A memory system comprising:
the memory controller of claim 8; and
a memory device configured to write the first input stream from the memory controller and to read the second input stream under control of the memory controller, and to output a read input stream as the read data.

15. A memory system comprising:
a memory device comprising a memory cell array including a plurality of multi-level memory cells for storing at least one of binary, ternary, or quaternary data; and
a memory controller for converting an input stream received from a host to provide write data that is stored in the memory device, and for converting read data received from the memory device to provide an output stream to the host, the read data corresponding to the stored write data, wherein:
the memory controller is configured to:
convert a part of the input stream comprising a plurality of alphabet letters from a higher numeral system to a lower numeral system only when a data state is determined to be a first state among a plurality of predetermined data states,
determine whether one of the converted alphabet letters can be output,
map the one converted alphabet letter to a different alphabet letter when the one converted alphabet letter cannot be output, and
combine, to provide the write data, the input stream and either the converted part of the input stream or the converted part of the input stream with the one converted alphabet letter replaced by the different alphabet letter, and
the memory controller is further configured to convert a part of the read data comprising a plurality of alphabet letters from the lower numeral system to the higher numeral system only when another data state is determined to be the first state based on the read data, and to combine the converted part and the read data to provide the output stream.

16. The memory system of claim 15, wherein the first state is one in which at least one of the plurality of alphabet letters cannot be output because the output would create a forbidden output pattern in conjunction with an output of other alphabet letters.

17. The memory system of claim 16, wherein the memory controller comprises:
a pattern transformer configured to convert the part of the input stream comprising the plurality of alphabet letters from the higher numeral system to the lower numeral system when the data state is determined to be the first state, and to insert the converted part into the combined stream; and
a pattern de-transformer configured to convert the part of the read data comprising the plurality of alphabet letters from the lower numeral system to the higher numeral system when the other data state is determined to be the first state, and to insert the converted part into the combined read data.

18. The memory system of claim 17, wherein the pattern transformer comprises:
a base converter configured to convert the part of the input stream into the lower numeral system;
a sub buffer configured to store the converted part;
a mapper configured to map the one alphabet letter in the converted part to the different alphabet letter when the one alphabet letter in the converted part cannot be output in the first state because the output would create a forbidden output pattern in conjunction with an output of other alphabet letters;
a main buffer configured to store the input stream and the mapped alphabet letter; and
a finite state machine configured to determine the data state based on the input stream and the mapped alphabet letter, and to control the main buffer and the mapper.

19. The memory system of claim 16, wherein the memory controller further comprises:
an error correction code (ECC) encoder configured to encode an output of the pattern transformer to provide the write data; and
an ECC decoder configured to decode the read data to correct errors in the output stream.

* * * * *